United States Patent [19]
Gross

[11] Patent Number: 5,206,181
[45] Date of Patent: Apr. 27, 1993

[54] METHOD FOR MANUFACTURING A SEMICONDUCTOR DEVICE WITH A SLOTTED METAL TEST PAD TO PREVENT LIFT-OFF DURING WAFER SCRIBING

[75] Inventor: David E. Gross, Dripping Springs, Tex.

[73] Assignee: Motorola, Inc., Schaumburg, Ill.

[21] Appl. No.: 709,553

[22] Filed: Jun. 3, 1991

[51] Int. Cl.$^5$ .......................................... H01L 21/304
[52] U.S. Cl. ..................................... 437/8; 437/226; 148/DIG. 28
[58] Field of Search ........................... 437/8, 226; 148/DIG. 28

[56] References Cited

U.S. PATENT DOCUMENTS

| | | | |
|---|---|---|---|
| 4,610,079 | 9/1986 | Abe et al. | 148/DIG. 28 |
| 4,835,592 | 5/1989 | Zommer | 357/85 |
| 5,003,374 | 3/1991 | Vokoun, III | 357/85 |
| 5,096,855 | 3/1992 | Vokoun, III | 437/226 |

FOREIGN PATENT DOCUMENTS 56-43740 4/1981 Japan.
2-30162 1/1990 Japan ................................. 437/226

*Primary Examiner*—Olik Chaudhuri
*Assistant Examiner*—David E. Graybill
*Attorney, Agent, or Firm*—Patricia S. Goddard

[57] ABSTRACT

A method for semiconductor wafer scribing utilizing perforated metal areas in the scribe regions. In one form, a method for fabricating a semiconductor device includes forming a plurality of semiconductor die (12) on a semiconductor wafer (10) such that the die are separated from one another by scribe regions (13). A test structure (14) is formed within one of the scribe regions and includes a perforated probe pad (16). In one embodiment, the probe pad is perforated by a plurality of slots (18). The perforations in the probe pad aid in scribing the semiconductor wafer by preventing metal lift-off which often occurs when cutting metal areas.

12 Claims, 2 Drawing Sheets

METHOD FOR MANUFACTURING A SEMICONDUCTOR DEVICE WITH A SLOTTED METAL TEST PAD TO PREVENT LIFT-OFF DURING WAFER SCRIBING

FIELD OF THE INVENTION

The present invention relates to semiconductor devices in general, and more particularly, to semiconductor devices having features to assist in cutting metal during semiconductor die singulation and to processes for fabricating these devices.

BACKGROUND OF THE INVENTION

Semiconductor device fabrication begins by forming a plurality of semiconductor die on a wafer or a slice of semiconducting material. Each die has one or more integrated circuits formed thereon by a process known as wafer fabrication. In a very simplistic explanation, wafer fabrication involves subjecting a semiconductor wafer to a series of depositions and etches of various conducting and insulating materials to form the circuit(s). Upon the completion of wafer fabrication, the semiconductor die are singulated, or in other words are separated from one another, by cutting the wafer into a plurality of individual semiconductor die. Each die is then assembled by encasing the die in a package body or protective coating and providing a way of electrically accessing the circuit(s) on the die.

As a method of monitoring and controlling the wafer fabrication process, many semiconductor manufacturers incorporate electrical test structures onto the semiconductor wafer. The test structures are formed simultaneously with the semiconductor die, but in general are much simpler circuits. The test structures are used to provide a reasonably accurate interpretation of how well the semiconductor die will perform in view of a few simple test results. In an effort to conserve valuable space on a semiconductor wafer, these test structures are quite small and are most often formed between the semiconductor die. Once wafer fabrication is complete, diagnostic testing is performed on the wafer's test structures to evaluate various electrical characteristics. Upon completion of diagnostic testing, the semiconductor die are cut from the wafer and singulated to prepare the die for subsequent assembly.

One problem that exists in using the test structures described above is that the test structures impede the ability to properly and reliably cut the wafer. Since the test structures are formed between semiconductor die, the test structures lie in the cutting path of the wafer. (Cutting the wafer is also referred to as "scribing" the wafer and thus the cutting path on the wafer, where the test structures are located, is sometimes called the "scribe region.") Because the test structures have already been utilized at this point in fabrication, there is no harm in destroying the test structures during the cutting operation. However, cutting through the structures often involves cutting through large metal regions which are used in the test structures as contact points or probe pads. Probe pads are coupled to the circuits formed within the test structure and are contacted during diagnostic testing by probe needles. The probe pads must be made large enough to ensure accurate placement of the probe needles during testing, thus the size of the probe pads is much larger than the actual circuitry. In cutting through the probe pads, much of the metal which forms the probe pad is torn away by the cutting element, for example a sawing blade. Although destroying the probe pad does not impact a semiconductor device's performance, any metal which is removed from the probe pad may adversely affect the device. For example, the torn metal may become lodged on one of the semiconductor die of the wafer, thereby short-circuiting two of the die which normally are to remain isolated. Therefore, having stray pieces of metal potentially thrown about throughout the assembly of a semiconductor device creates serious reliability concerns.

Because test structures impede the ability to properly and reliably singulate die on a semiconductor wafer, a need exists for an improved semiconductor device, and more specifically, for an improved semiconductor device which has features to aid in cutting metal regions and a process for fabricating the same.

SUMMARY OF THE INVENTION

The foregoing needs are met and other advantages are achieved with the present invention. In one embodiment, a process for fabricating a semiconductor device utilizes features of the device which aid in cutting metal within scribe regions. The process is comprised of providing a semiconductor wafer and forming a plurality of semiconductor die thereon. Each die on the wafer is separated from other die by a scribe region. A test structure is formed in at least one of the scribe regions and has at least one perforated metal probe pad to facilitate scribing the semiconductor wafer without substantially tearing the metal probe pad. In another embodiment, a semiconductor device is comprised of a semiconductor die having a plurality of sides. A portion of a test structure is attached to a side of the semiconductor die. The test structure portion has a metal probe pad which is perforated to facilitate singulating the semiconductor die from a semiconductor wafer without substantially tearing the metal probe pad.

These and other features, and advantages, will be more clearly understood from the following detailed description taken in conjunction with the accompanying drawings.

DETAILED DESCRIPTION OF A PREFERRED EMBODIMENT

After test structures have been used in a conventional manner to evaluate electrical characteristics of circuits formed on a semiconductor wafer, the wafer is scribed to singulate a plurality of semiconductor die formed thereon. Because test structures are usually formed between the die, scribing the wafer often involves cutting through the test structures. In cutting through the test structures, a cutting tool, such as a saw, must cut large metal regions which are used as contact points or probe pads during diagnostic testing. A problem encountered by cutting these large metal regions is that pieces of the metal tear away from or lift off the test structure and have the opportunity to settle onto neighboring semiconductor die. Having foreign pieces of metal on a die surface creates a serious reliability problem since the metal can potentially short-circuit electrical elements of the die or of a packaged semiconductor device.

The present invention resolves the problem of metal lift-off which occurs as a result of cutting a semiconductor wafer. Lift-off is prevented in the present invention by perforating large metal areas within scribe regions, such as metal probe pads of test structures. By perforating the metal probe pads, less force is required to cut the metal. With less cutting force acting upon the metal probe pad, it is less likely that a piece of the metal will tear away or lift-off from the test structure. An analogy between perforated metal probe pads and perforated tablet paper can be drawn to better understand why the present invention alleviates the problem of metal lift-off. In tearing a piece of paper, it is much easier to tear along a crease or a perforation formed in the paper than to tear where such features do not exist. Tearing the paper in areas without creases or perforation results in paper edges which are generally quite jagged. In other words, the tear is not clean. Similarly, cutting through a large region of metal will result in very jagged edges which may break off, causing the metal lift-off problem described above. By perforating a large metal region, a cut through the region will be clean such that metal lift-off is prevented.

Figure 1:
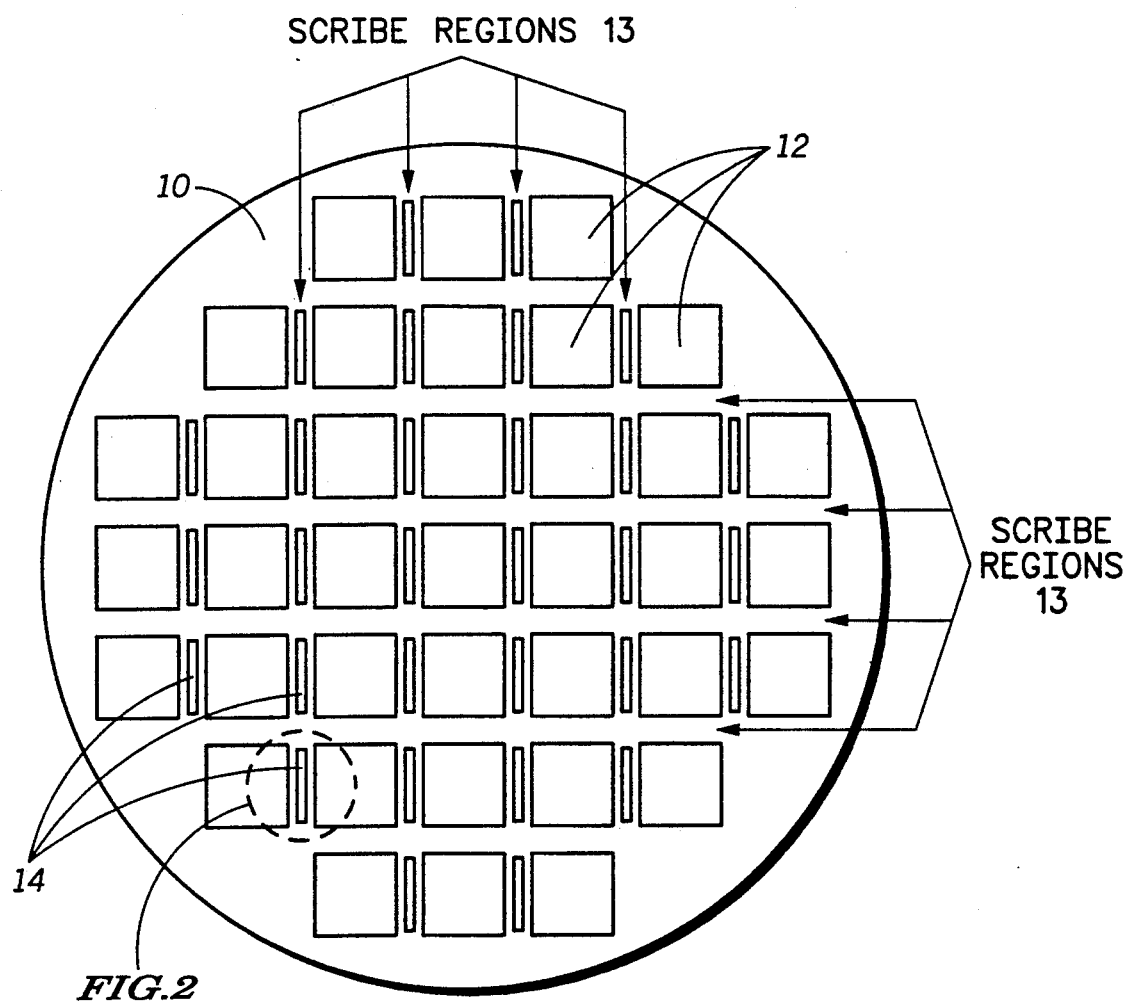
FIG. 1 is a planar view of a semiconductor wafer having a plurality of semiconductor die formed thereon in accordance with the present invention.
Figure 2:
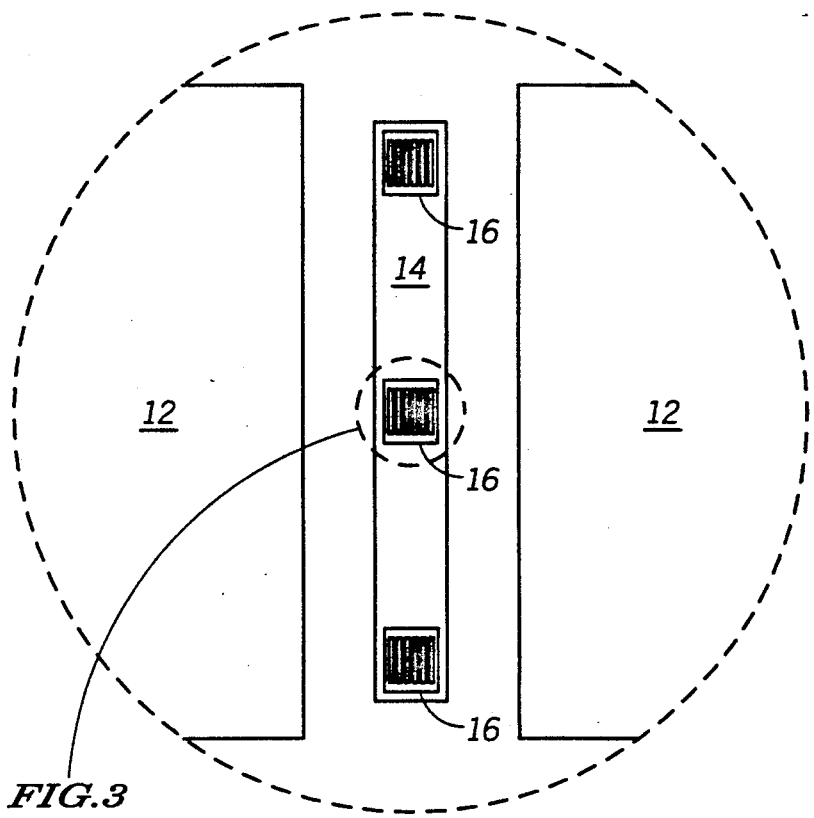
FIG. 2 is an expanded view of a test structure formed between the semiconductor die of FIG. 1.
Figure 3:
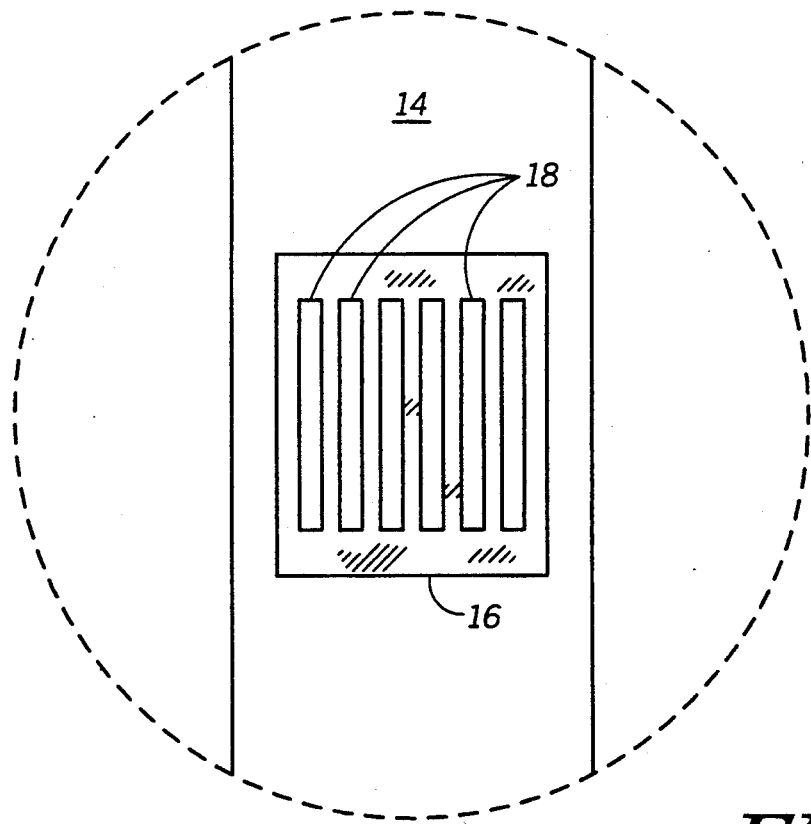
FIG. 3 is an expanded view of a portion of the test structure of FIG. 1 which illustrates a perforated metal probe pad in accordance with the present invention.

A preferred embodiment of the present invention is illustrated in FIGS. 1-3. The figures are a series of magnified views of a semiconductor device, in accordance with the present invention, which illustrate the use of test structures having perforated probe pads to facilitate wafer cutting. In FIG. 1, a semiconductor wafer 10 is illustrated as having a plurality of semiconductor die 12 formed thereon. The particular type of material used for semiconductor wafer 10 is not relevant to the invention. Nor is it important what type of semiconductor die 12 are formed on the wafer. The semiconductor die 12 are separated from one another by a plurality of scribe regions 13. Semiconductor wafer 10 is cut through scribe regions 13 to singulate the plurality of semiconductor die 12 at an appropriate time in fabrication. Notice that in FIG. 1 the scribe regions which run vertically have a plurality of test structures 14. Test structures are commonly used in semiconductor manufacturing to provide a quick and relatively simple way of measuring electrical parameters which are representative of the parameters of the semiconductor die. In general, test structures are formed in only one direction, e.g. horizontally or vertically, to simplify testing of the structures. However, any test structure orientation is suitable in practicing the present invention. Similarly, the number of test structures formed on a wafer is not limited by the invention. Nor is it required that every semiconductor die have a corresponding test structure. One test structure may be formed for any number of semiconductor die.

To more clearly illustrate a test structure of a semiconductor device in accordance with the present invention, the test structure encircled by a dashed line in FIG. 1 is illustrated in FIG. 2. As FIG. 2 illustrates, test structure 14 is positioned between two semiconductor die 12 and in scribe region 13. As discussed previously, test structures are often formed with contact points or probe pads which cause a metal lift-off problem upon cutting the pads. To alleviate this problem, test structure 14 has a plurality of perforated probe pads 16. The perforated probe pads 16 require less cutting force and therefore will not experience metal tearing or lift-off during die singulation. FIG. 2 illustrates that three probe pads are included within test structure 14; however, the number of perforated pads used is not restricted by the invention. The number of pads is usually determined by the amount of circuitry (not shown) formed within the test structure. In addition, the invention does not require a specific probe pad size. Probe pad size is usually chosen such that a probe needle can accurately be positioned on the pad.

In a preferred embodiment, probe pads 16 are perforated by forming slots in the pads. The encircled probe pad 16 of FIG. 2 is also illustrated in FIG. 3 to more clearly represent the pad. Probe pad 16 has a plurality of slots 18 which are oriented in a direction which is preferably the same as the cutting direction. While FIG. 3 illustrates probe pad 16 as having six slots formed therein, any reasonable number of slots may formed in the pad to prevent metal lift-off. Slots which are used to perforate the probe pads need not extend from essentially one side of the pad to the other as illustrated, but may instead, for example, be a plurality of smaller slots formed consecutively from end-to-end. Furthermore, perforations other than slots may used in accordance with the present invention. For example, probe pads having a plurality of holes are also suitable for preventing metal lift-off. Regardless of the type of perforations employed, the orientation of the perforations should be aligned with the direction of wafer cutting in order to achieve the most benefit. For example in probe pad 16 of FIG. 3, cutting through the pad from left to right (or vice-versa) would be less advantageous than cutting from top to bottom (or vice-versa) since slots 18 are vertically oriented. Another guide to achieving the most benefit from perforated probe pads is to provide perforations which do not leave the metal probe pad discontinuous. Probe pad 16 of FIG. 3 is considered to be one continuous piece of metal even though the pad includes slots 18. If a probe pad were made discontinuous by the perforations, the pad would actually be comprised of a plurality of metal pieces, thereby weakening the overall strength of the metal pad and increasing the susceptibility to metal-lift. Furthermore, contacting a probe pad with a probe needle is less reliable if the probe pad metal is discontinuous than if the pad is formed from a substantially continuous piece of metal. For the similar reasons, any perforations which are formed in probe pads in accordance with the present invention, should not have a substantial negative impact on the ability to reliably and accurately contact the pad with a probe needle during diagnostic testing.

Upon scribing a semiconductor wafer, a portion of a test structure formed in scribe regions of the wafer remain attached to neighboring semiconductor die. Scribing does not completely destroy test structures, except in an operational sense. Instead, test structures are most often divided when scribed such that about one-half of the test structure remains an integral part of a neighboring semiconductor die to the left, while the remaining half is integral to a neighboring semiconductor die to the right. With respect to the semiconductor wafer portion illustrated in FIG. 2, scribing would occur in a vertical direction (i.e. top to bottom, or vice-versa) through test structure 14. As a result, portions of the test structure to the left of the cut would remain integral to the left-most semiconductor die 12 of FIG. 2, while the portions of the test structure to the right of the cut would remain integral to the right-most semiconductor die 12. The two "half test structures" created by scribing a test structure are not truly one-half of the original uncut test structure since scribing consumes a portion of the original test structure and is subject to slight misalignment.

In the foregoing description and illustrations, the benefit of utilizing the present invention to prevent metal lift-off while cutting scribe regions of a wafer has been demonstrated. Not only does the invention facilitate cutting large metal regions, but the invention may also be used without increasing semiconductor device fabrication cost. Perforations can be formed in metal probe pads at the same time the probe pad is defined. Therefore, no additional deposition, etching, or masking steps are needed. Another advantage associated with the present invention is that implementing the invention does not require alteration in the size of metal probe pads or the test structure and does not dictate the location of the test structure on a semiconductor wafer. Moreover, perforations can easily be formed in a probe pad without affecting the reliability and accuracy of diagnostic testing results.

Thus it is apparent that there has been provided, in accordance with the invention, a semiconductor device with features to aid in cutting metal and a process for fabricating the same that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, perforations other than slots are suitable in the invention. Any feature which aids in the separation, tearing, or cutting of metal can be used as perforations in accordance with the invention. In addition, the invention is not limited to any particular number of perforations or to perforation size. It is also important to emphasize that in singulating die from a wafer, any cutting technique may benefit from the present invention, including sawing, laser drilling, ultrasonic cutting, and high pressure water cutting among others. Therefore, it is intended that this invention encompass all such variations and modifications which fall within the scope of the appended claims.

I claim:

1. A process for fabricating a semiconductor device with features to aid in cutting metal within a scribe region of the device, comprising the steps of:
   providing a semiconductor wafer;
   forming a plurality of spaced apart semiconductor die on the semiconductor wafer, each die being separated from one another by one of a plurality of scribe regions; and
   forming a test structure in at least one of the scribe regions, the test structure having at least one metal probe pad, the metal probe pad having a plurality of slots oriented in a predetermined direction; and
   scribing the semiconductor wafer along the plurality of scribe regions and through the metal probe pad substantially parallel to the longitudinal axes of the slots to substantially prevent metal lift-off generated from the metal probe pad.

2. The process of claim 1 wherein the step of forming a test structure having at least one metal probe pad comprises forming a test structure having at least one metal probe pad which is an electrically continuous metal region.

3. The process of claim 1 wherein the step of forming a test structure comprises forming an electrical test structure.

4. The process of claim 1 wherein the step of scribing the semiconductor wafer comprises sawing the semiconductor wafer.

5. The process of claim 3 further comprising the step of
   electrically testing the test structure using the metal pad as a test contact point.

6. The process of claim 5 wherein the step of electrically testing the test structure comprises the step of electrically contacting the metal probe pad with a probe needle, and wherein the step of forming an electrical test structure comprises forming an electrical test structure having at least one metal probe pad, the metal probe pad being electrically continuous and having a plurality of slots, wherein the slots have a size which does not impede electrically contacting the metal probe pad with the probe needle.

7. A process for fabricating a semiconductor device with features to aid in cutting metal within a scribe region of the device, comprising the steps of:
   providing a semiconductor wafer;
   forming a plurality of spaced apart semiconductor die on the semiconductor wafer, the plurality of die being separated from one another by a plurality of horizontal scribe regions and a plurality of vertical scribe regions;
   forming an electrical test structure in at least one of the horizontal or vertical scribe regions, the test structure having at least one metal probe pad having a row of substantially rectangular slots, each slot having a longitudinal axis; and
   singulating the plurality of semiconductor die by cutting the semiconductor wafer through the horizontal and vertical scribe regions and through the metal probe pad in a direction substantially parallel to the longitudinal axes of the slots such that metal lift-off generation is prevented.

8. The process of claim 7 wherein the step of singulating the plurality of semiconductor die comprises sawing the semiconductor wafer.

9. The process of claim 7 wherein the step of singulating the plurality of semiconductor die comprises singulating the plurality of semiconductor die such that a portion of the test structure is integral to one of the semiconductor die.

10. The process of claim 7 wherein the step of forming an electrical test structure comprises forming an electrical test structure having at least one slotted metal probe pad which is electrically continuous.

11. The process of claim 10 further comprising the step of electrically testing the test structure by electrically contacting the metal probe pad with a probe needle, prior to singulating the plurality of semiconductor die.

12. The process of claim 11 wherein the step of forming an electrical test structure comprises forming an electrical test structure having at least one slotted metal probe pad in which the slots have a size which does not impede electrically contacting the metal probe pad with the probe needle.

* * * * *

UNITED STATES PATENT AND TRADEMARK OFFICE
CERTIFICATE OF CORRECTION

PATENT NO. : 5,206,181
DATED : April 27, 1993
INVENTOR(S) : David E. Gross It is certified that error appears in the above-identified patent and that said Letters Patent is hereby corrected as shown below:

In Column 5, lines 58-59:

In claim 1, lines 11 and 12

Change "plurality of slots oriented in a predetermined direction" to --row of substantially rectangular slots, each slot having a longitudinal axis--.

Signed and Sealed this

Twenty-fifth Day of January, 1994

Attest:

BRUCE LEHMAN

*Attesting Officer*  *Commissioner of Patents and Trademarks*